(12) United States Patent
Goh et al.

(10) Patent No.: US 7,112,916 B2
(45) Date of Patent: Sep. 26, 2006

(54) LIGHT EMITTING DIODE BASED LIGHT SOURCE EMITTING COLLIMATED LIGHT

(76) Inventors: Kee Siang Goh, 36, Jalan Besi, Island Park 11600, Penang (MY); Boon Kheng Lee, 105, Lorong Damai 6 Taman Desa Damai, Simpang Empat, Skedah (MY) 06650A; Yee Loong Chin, 3, Persiaran Zarib 4, Laman Pinji Mawrah, 31500 Laliat, Perak (MY); Gurbir Singh, 11 Solak Besi, Island Park, 11600, Penang (MY)

( * ) Notice: Subject to any disclaimer, the term of this patent is extended or adjusted under 35 U.S.C. 154(b) by 194 days.

(21) Appl. No.: 10/267,759

(22) Filed: Oct. 9, 2002

(65) Prior Publication Data
US 2004/0070337 A1   Apr. 15, 2004

(51) Int. Cl.
*H05B 33/04* (2006.01)

(52) U.S. Cl. .................. 313/113; 313/504; 362/341; 362/296; 362/800; 257/98

(58) Field of Classification Search .......... 313/512, 313/498, 113, 503, 504, 506, 509, 112; 362/800, 362/555, 341, 296, 310; 348/786; 372/43, 372/45; 257/98, 79, 81, 91, 99, 100
See application file for complete search history.

(56) References Cited

U.S. PATENT DOCUMENTS

| | | | | | |
|---|---|---|---|---|---|
| 3,821,775 | A | * | 6/1974 | Biard | 257/98 |
| 5,537,433 | A | * | 7/1996 | Watanabe | 372/45 |
| 5,780,174 | A | * | 7/1998 | Tokito et al. | 428/690 |
| 6,328,456 | B1 | * | 12/2001 | Mize | 362/311 |
| 6,339,290 | B1 | * | 1/2002 | Nakaya | 313/506 |
| 6,569,544 | B1 | * | 5/2003 | Alain et al. | 428/690 |
| 6,611,096 | B1 | * | 8/2003 | McCormick et al. | 313/506 |
| 6,642,547 | B1 | * | 11/2003 | Matsubara et al. | 257/98 |
| 6,710,544 | B1 | * | 3/2004 | Schliep et al. | 313/512 |
| 6,900,466 | B1 | * | 5/2005 | Hommel et al. | 257/79 |

* cited by examiner

*Primary Examiner*—Ashok Patel

(57) ABSTRACT

A light emitting diode, a reflector and a platform are employed within a light source. The light emitting diode emits light exclusively from its side surfaces. The reflector has a parabolic reflective surface that collimates any portion of the light reflecting from the parabolic reflective surface. The platform supports a centering of the light emitting layer(s) of the light emitting diode on a focus point of the parabolic reflective surface.

20 Claims, 6 Drawing Sheets

ID BASED LIGHT
LIGHT EMITTING DIODE BASED LIGHT SOURCE EMITTING COLLIMATED LIGHT

FIELD OF THE INVENTION

The present invention generally relates to the field of light sources. More specifically, the present invention relates to a Light Emitting Diode ("LED") based light source that is independently operative to emit a collimated light.

DESCRIPTION OF THE RELATED ART

FIG. 1 illustrates a known light source 10 having a LED 11 positioned on an electrical connector 12 to thereby emit light from its top surface and side surfaces as exemplified by the dashed arrows. The reflector 13 has a conical reflective surface serving the known function of reflecting the light emitted from the LED 11 in the direction of the conical reflective surface. A dome 14 serves the known function of focusing the light reflected from the conical reflective surface of the reflector 13 into an operational radiation pattern as the light leaves the dome 14. As illustrated, neither the reflector 13 nor the dome 14 collimates the light reflected from the conical reflective surface of the reflector 13. The light source 10 is therefore incapable of serving as an independent light source in devices requiring collimated light (e.g., a remote sensing device, a surface analysis device, etc.). Presently, a collimator (not shown in FIG. 1) is positioned relative to the dome 14 in an effort to collimate the light from light source 10. However, employment of a collimator with the light source 10 increases the manufacturing costs of devices incorporating one or more light sources 10. Moreover, operational specifications relating to the incorporation of the light source 10 within a device may make it impractical to employ a collimator with the light source 10.

The present invention advances the art by contributing a LED based light source that is independently operative to emit collimated light.

SUMMARY OF THE INVENTION

A light source comprising a light emitting diode and a reflector having a parabolic reflective surface is constructed in accordance with an embodiment of the present invention. In operation, the light emitting diode emits light exclusively from one or more of its side surfaces, and the parabolic reflective surface collimates at least a portion of the light. Various designs of light emitting diodes and reflectors may be employed in the light source.

Various forms, features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

DETAILED DESCRIPTION OF THE EMBODIMENTS

Figure 1:
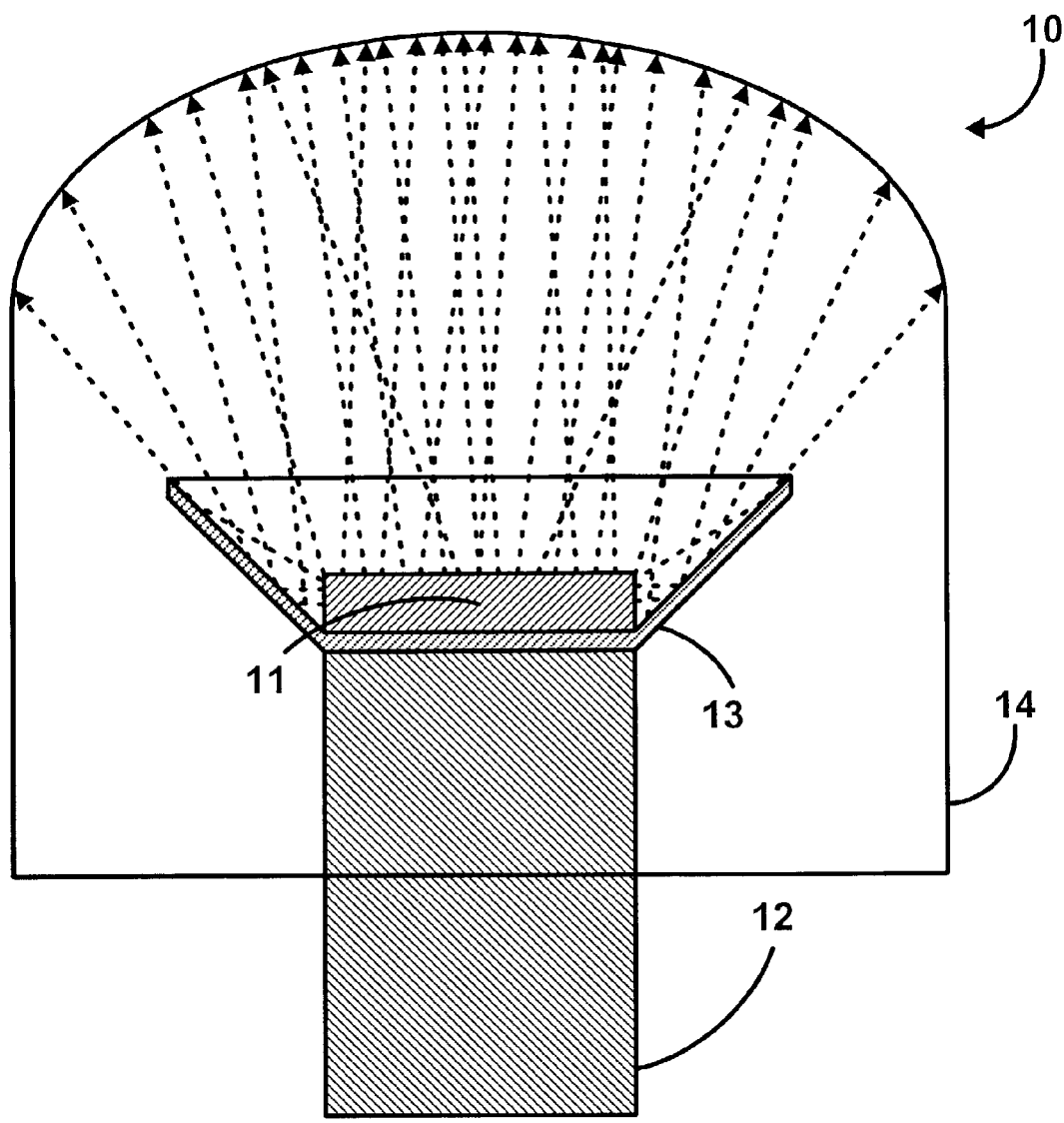
FIG. 1 illustrates a cross-sectional side view of a known light source.
Figure 2:
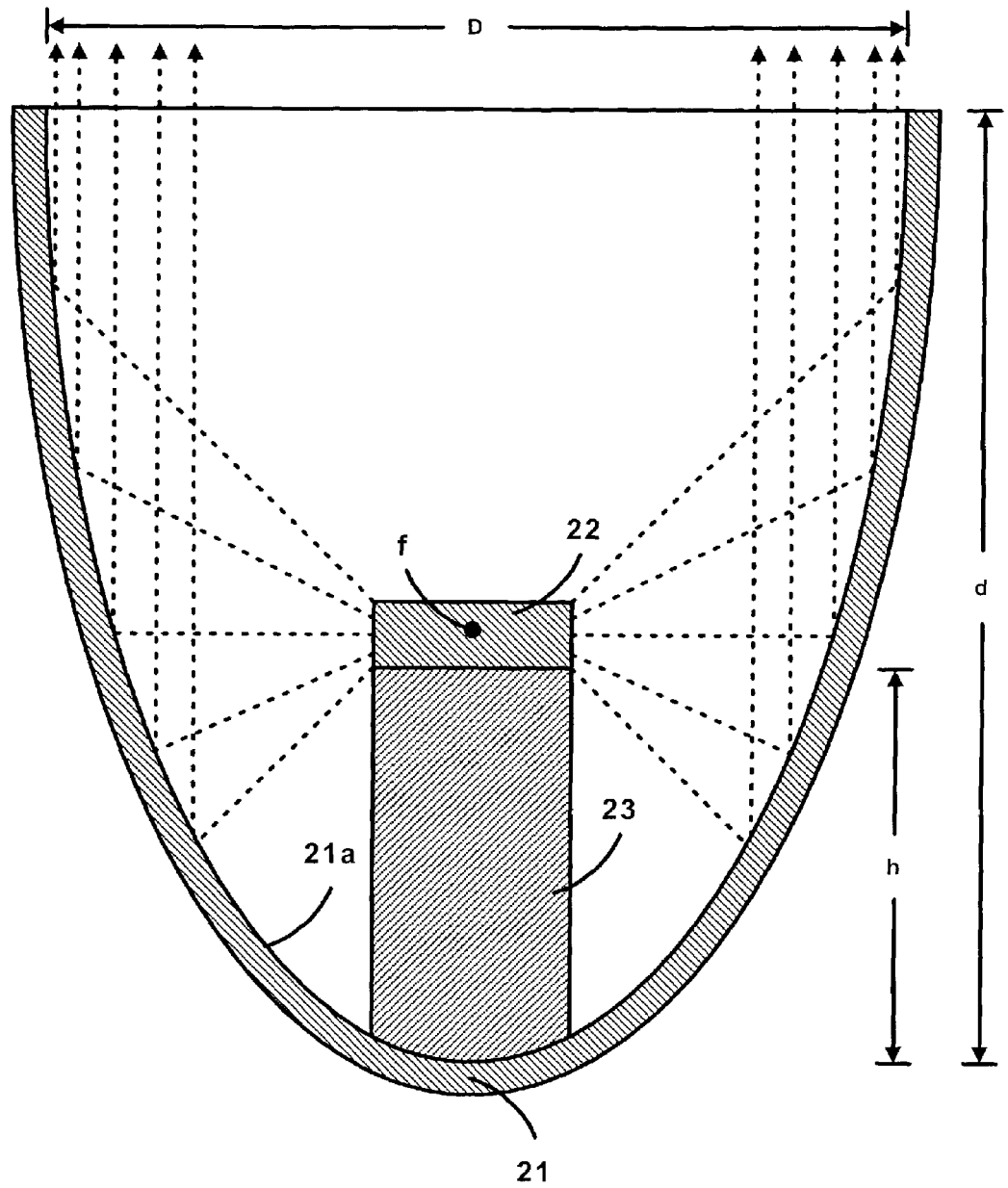
FIG. 2 illustrates a cross-sectional side view of a light source in accordance an embodiment of the present invention.

FIG. 2 illustrates a reflector 21 and a LED 22, which are the primary components of a light source in accordance with one embodiment of the present invention. The LED 22 emits light exclusively from one or more of its side surfaces as exemplified by the dashed arrows. The reflector 21 has a parabolic reflective surface 21a composed of conventional material suitable for reflecting any portion of the light that contacts the parabolic reflective surface 21a (e.g., lead frame material with mirror finishing). The parabolic shape of the reflective surface 21a collimates all of the reflected light. In one embodiment, the reflector 21 is a unitary piece and conventional techniques are employed to shape the parabolic reflective surface 21a, such as, for example, punching/etching, drilling, electro-discharge machining (EDM), sheer spinning, and molding+mirror coating. In an alternative embodiment, the reflector 21 consists of flat and/or curved reflective segments 21a, and conventional techniques are employed to develop and refine the parabolic reflective surface 21a, such as, for example, finite element analysis.

The focus point f associated with the parabolic reflective surface 21a is dependent upon the aperture diameter D and the parabolic reflective surface depth d of the parabolic reflective surface 21a in accordance with the following equation [1]:

$$f = \frac{D^2}{16d} \quad [1]$$

In the illustrated embodiment, the LED 22 is positioned on a focus point platform 23 upwardly extending from a base of the parabolic reflective surface 21a whereby the light emitting layer(s) of the LED 22 is(are) centered on the focus point f. For an embodiment of the LED 22 having a 250 μm thickness, a 4 mm aperture diameter D and a 2 mm parabolic reflective surface depth d have been found to facilitate a positioning of the LED 22 on the focus point platform 23 having a 0.5 mm height h whereby a substantial portion of the light emitting from the side surfaces of the LED 22 is collimated by the parabolic reflective surface 21a.

Numerous embodiments of the LED 22 can be employed in a light source in accordance with the present invention. FIGS. 3–8 illustrate six (6) embodiments of the LED 22.

Figure 3:
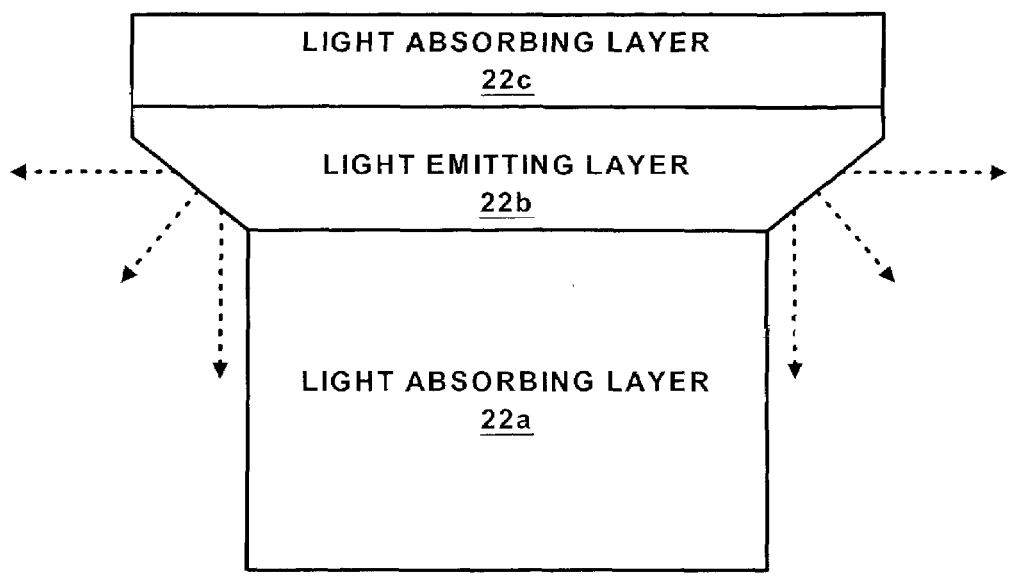
FIG. 3 illustrates a side view of a first embodiment in accordance with the present invention of a LED usable in the light source of FIG. 2.

FIG. 3 illustrates one of the embodiments of the LED 22, which includes a bottom light absorbing layer 22a, a light emitting layer 22b overlying the bottom light absorbing layer 22a, and a top light absorbing layer 22c overlying the light emitting layer 22b. Due to the light absorbing nature of the light absorbing layers 22a and 22c, the illustrated LED emits light exclusively from the side surfaces of the light emitting layer 22b as exemplified by the dashed arrows.

Figure 4:
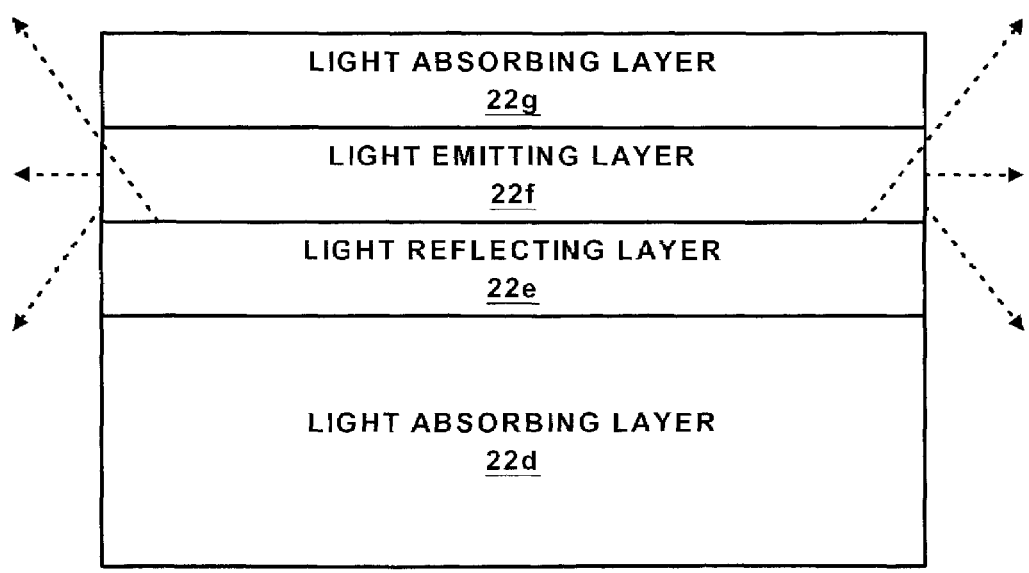
FIG. 4 illustrates a side view of a second embodiment in accordance with the present invention of a LED usable in the light source of FIG. 2.

FIG. 4 illustrates a second embodiment of the LED 22, which includes a bottom light absorbing layer 22d, a light reflecting layer 22e overlying the bottom light absorbing layer 22d, a light emitting layer 22f overlying the light reflecting layer 22e, and a top light absorbing layer 22g overlying the light emitting layer 22f. Due to the light absorbing nature of the light absorbing layers 22d and 22g and the light reflecting nature of the light reflecting layer 22e, the illustrated LED emits light exclusively from the side surfaces of the light emitting layer 22f as exemplified by the dashed arrows.

Figure 5:
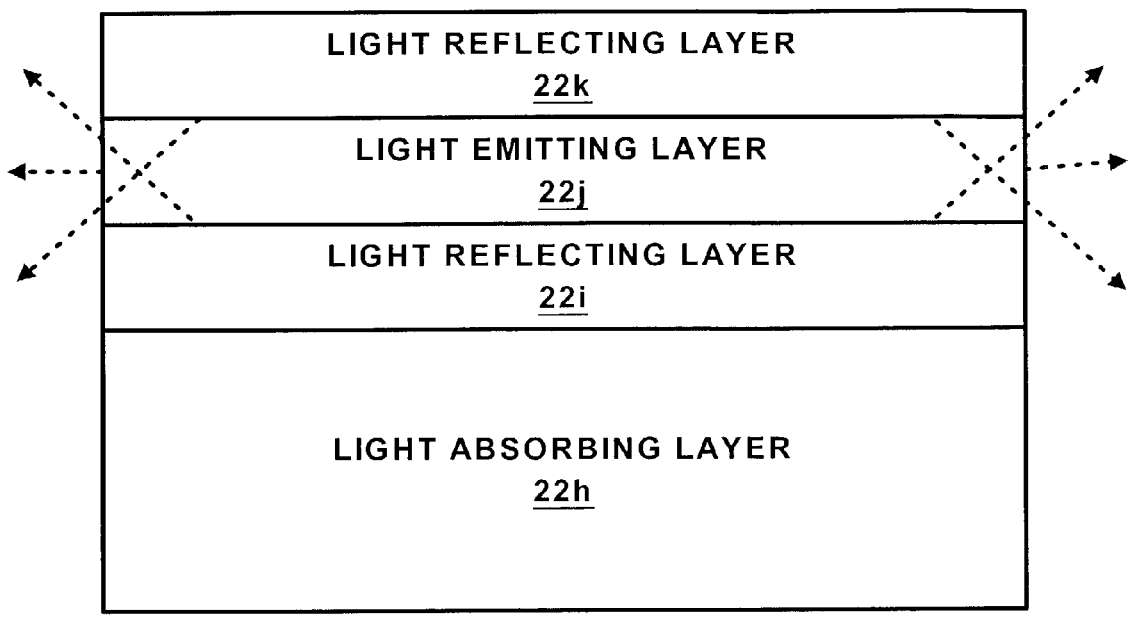
FIG. 5 illustrates a side view of a third embodiment in accordance with the present invention of a LED usable in the light source of FIG. 2.

FIG. 5 illustrates a third embodiment of the LED 22, which includes a bottom light absorbing layer 22h, a light reflecting layer 22i overlying the bottom light absorbing layer 22h, a light emitting layer 22j overlying the light reflecting layer 22i, and a top light reflecting layer 22k overlying the light emitting layer 22j. Due to the light absorbing nature of the light absorbing layer 22h and the light reflecting nature of the light reflecting layers 22i and 22k, the illustrated LED emits light exclusively from the side surfaces of the light emitting layer 22j as exemplified by the dashed arrows.

Figure 6:
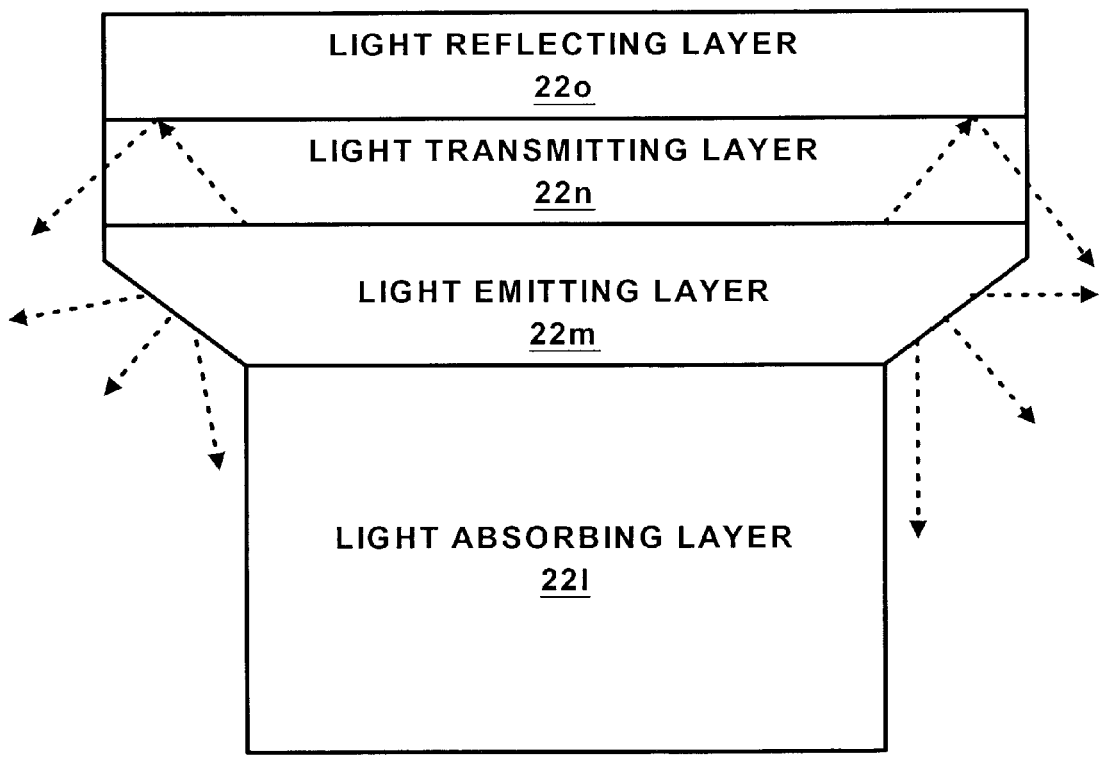
FIG. 6 illustrates a side view of a fourth embodiment in accordance with the present invention of a LED usable in the light source of FIG. 2.

FIG. 6 illustrates a fourth embodiment of the LED 22, which includes a bottom light absorbing layer 22l, a light emitting layer 22m overlying the bottom light absorbing layer 22l, a light transmitting layer 22n overlying the light emitting layer 22m, and a top light reflecting layer 22o overlying the light transmitting layer 22n. Due to the light absorbing nature of the light absorbing layer 22l and the light reflecting nature of the light reflecting layer 22o, the illustrated LED emits light exclusively from the side surfaces of the light emitting layer 22m and the light transmitting layer 22n as exemplified by the dashed arrows.

Figure 7:
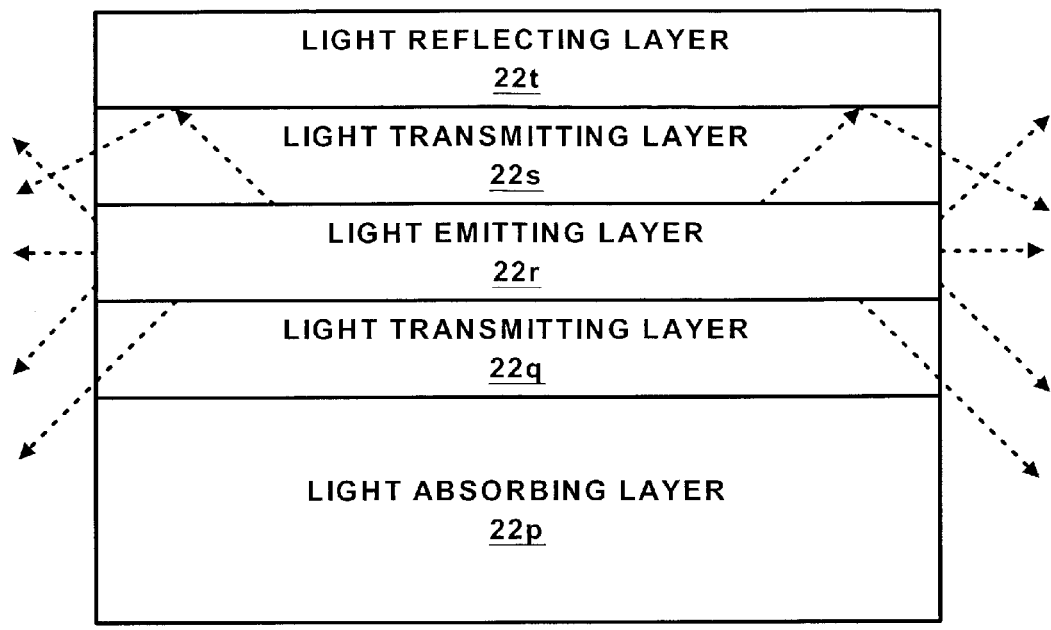
FIG. 7 illustrates a side view of a fifth embodiment in accordance with the present invention of a LED usable in the light source of FIG. 2.

FIG. 7 illustrates a fifth embodiment of the LED 22, which includes a bottom light absorbing layer 22p, a light transmitting layer 22q overlying the bottom light absorbing layer 22p, a light emitting layer 22r overlying the light transmitting layer 22q, a light transmitting layer 22s overlying the light emitting layer 22r, and a top light reflecting layer 22t overlying the light transmitting layer 22s. Due to the light absorbing nature of the light absorbing layer 22p and the light reflecting nature of the light reflecting layer 22t, the illustrated LED emits light exclusively from the side surfaces of the light emitting layer 22r and the light transmitting layers 22q and 22s as exemplified by the dashed arrows.

Figure 8:
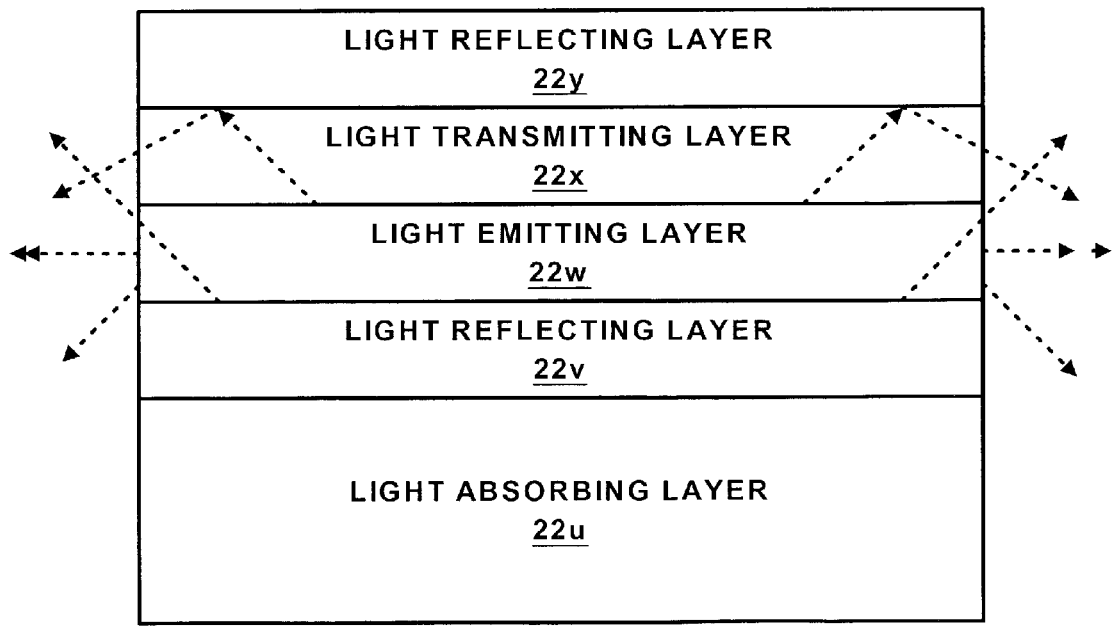
FIG. 8 illustrates a side view of a sixth embodiment in accordance with the present invention of a LED usable in the light source of FIG. 2.

FIG. 8 illustrates a sixth embodiment of the LED 22, which includes a bottom light absorbing layer 22u, a light reflecting layer 22v overlying the bottom light absorbing layer 22u, a light emitting layer 22w overlying the light reflecting layer 22v, a light transmitting layer 22x overlying the light emitting layer 22w, and a top light reflecting layer 22y overlying the light transmitting layer 22x. Due to the light absorbing nature of the light absorbing layer 22u and the light reflecting nature of the light reflecting layers 22v and 22y, the illustrated LED emits light exclusively from the side surfaces of the light emitting layer 22w and the light transmitting layer 22x as exemplified by the dashed arrows.

Figure 9:
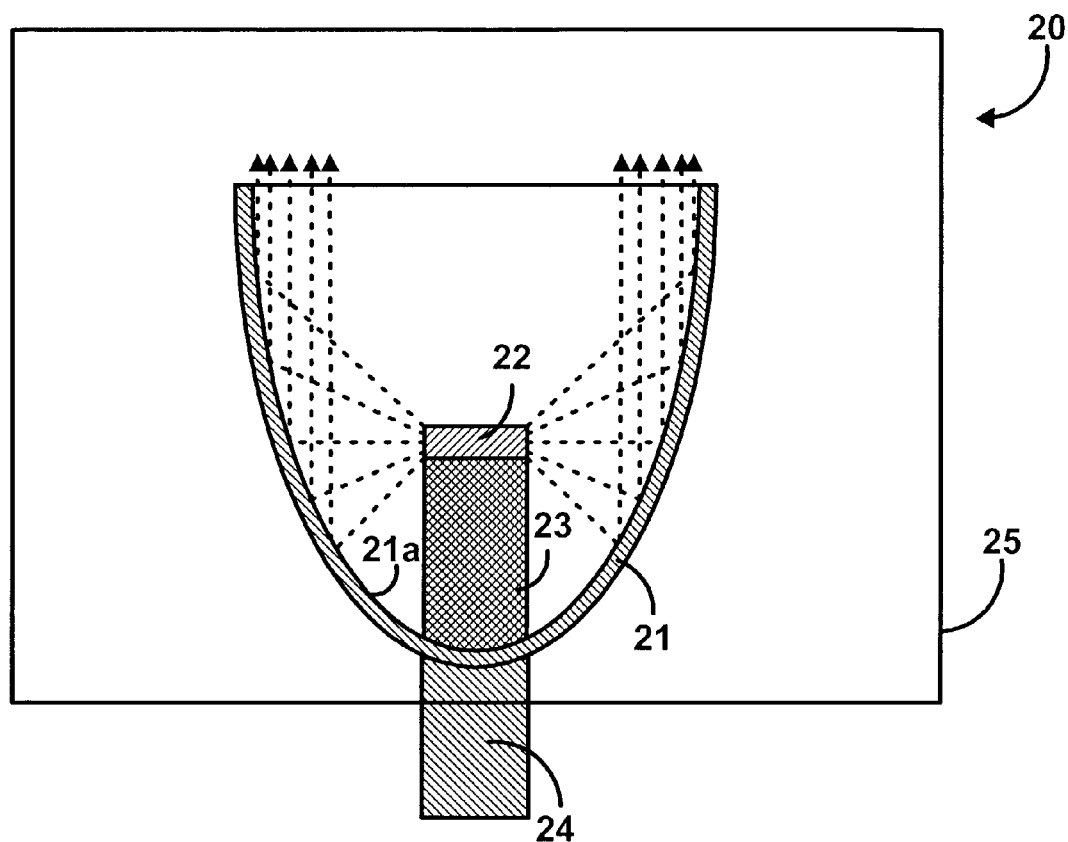
FIG. 9 illustrates a cross-sectional side view of one operational embodiment of the light source of FIG. 2 encapsulated within a transmitting epoxy.

From the preceding description of the reflector 21 and the LED 22, those having ordinary skill in the art will appreciate that the number of operational embodiments of a light source employing reflector 21 and LED 22 is essentially limitless. FIG. 9 illustrates one of the operational embodiments of a light source 20 in accordance with the present invention. In addition to the reflector 21, the LED 22 and the platform 23, the light source 20 includes an electrical connector 24. The electrical connector 24 includes conventional components (not shown) for communicating drive signals to the LED 22 from a conventional LED driver (not shown). For embodiments of the LED 22 employing a top light reflecting layer (e.g., light reflecting layer 22k illustrated in FIG. 5), the top light reflecting layer is additionally utilized as a bond pad for an additional electrical connection to the LED driver. The reflector 21, the LED 22 and the platform 23 are conventionally encapsulated within a transmitting epoxy 25.

The present invention may be embodied in other specific forms without departing from its essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A light source, comprising:
    a light emitting diode including:
        a light emitting layer operable to emit light; and
        a first light absorbing layer adjacent the light emitting layer to absorb a first portion of the light emitted by the light emitting layer in a direction of the first light absorbing layer; and
    a reflector having a parabolic reflective surface operable to reflect and collimate a second portion of the light emitted from the light emitting layer in a direction of the parabolic reflective surface, wherein light provided by the light source exclusively consists of the second portion of the light emitted from the light emitting layer as reflected and collimated by the reflector.

2. The light source of claim 1, further comprising:
    a platform connected to the parabolic reflective surface, the platform for supporting the light emitting diode, wherein the platform provides support for centering the light emitting layer on a focus point of the parabolic reflective surface.

3. The light source of claim 1, further comprising:
    a transparent material encapsulating the light emitting diode and the reflector, the transparent material having a planar surface wherein the second portion of the light emitted from the light emitting layer is collimated in a direction of the planar surface of the transparent material.

4. The light source of claim 1, wherein the first light absorbing layer overlays the light emitting layer.

5. The light source of claim 4,
    wherein the light emitting diode further includes a second light absorbing layer; and
    wherein the light emitting layer overlays the second light absorbing layer.

6. The light source of claim 5, wherein the second light absorbing layer is adjacent the light emitting layer to absorb a third portion of the light emitted by the light emitting layer in a direction of the second light absorbing layer.

7. The light source of claim 4,
wherein the light emitting diode further includes a light reflecting layer; and
wherein the light emitting layer overlays the light reflecting layer.

8. The light source of claim 7, wherein the light reflecting layer is adjacent the light emitting layer to reflect a third portion of the light emitted by the light emitting layer in a direction of the light reflecting layer.

9. The light source of claim 4,
wherein the light emitting diode further includes a light transmitting layer; and
wherein the light emitting layer overlays the light transmitting layer.

10. The light source of claim 9, wherein the light transmitting layer is adjacent the light emitting layer to transmit a third portion of the light emitted by the light emitting layer in a direction of the light transmitting layer.

11. The light source of claim 1, wherein the light emitting layers overlays the first light absorbing layer.

12. The light source of claim 11, wherein the light emitting diode further includes a second light absorbing layer overlying the light emitting layer.

13. The light source of claim 11, wherein the light emitting diode further includes a light reflecting layer overlying the light emitting layer.

14. The light source of claim 13, wherein the light reflecting layer is adjacent the light emitting layer to reflect a third portion of the light emitted by the light emitting layer in a direction of the light reflecting layer.

15. The light source of claim 11, wherein the light emitting diode further includes a light transmitting layer overlying the light emitting layer.

16. The light source of claim 15, wherein the light transmitting layer is adjacent the light emitting layer to transmit a third portion of the light emitted by the light emitting layer in a direction of the light transmitting layer.

17. A light source, comprising:
a light emitting diode including:
a light absorbing layer;
a light emitting layer overlaying the light absorbing layer, wherein the light emitting layer is operable to emit light and the light absorbing layer is adjacent the light emitting layer to absorb a first portion of the light emitted by the light emitting layer in a direction of the light absorbing layer; and
a light reflecting layer overlaying the light emitting layer; and
a reflector having a parabolic reflective surface operable to reflect and collimate a second portion of the light emitted from the light emitting layer in a direction of the parabolic reflective surface.

18. The light source of claim 17, wherein the light reflecting layer is adjacent the light emitting layer to reflect a third portion of the light emitted by the light emitting layer in a direction of the light reflecting layer.

19. A light source, comprising:
a light emitting diode including:
a light reflecting layer;
a light emitting layer overlaying the light reflecting layer; and
a light absorbing layer overlaying the light emitting layer, wherein the light emitting layer is operable to emit light and the light absorbing layer is adjacent the light emitting layer to absorb a first portion of the light emitted by the light emitting layer in a direction of the light absorbing layer; and
a reflector having a parabolic reflective surface operable to reflect and collimate a second portion of the light emitted from the light emitting layer in a direction of the parabolic reflective surface.

20. The light source of claim 19, wherein the light reflecting layer is adjacent the light emitting layer to reflect a third portion of the light emitted by the light emitting layer in a direction of the light reflecting layer.

* * * * *